(12) United States Patent
Cure

(10) Patent No.: US 11,407,574 B2
(45) Date of Patent: Aug. 9, 2022

(54) SYSTEM FOR TRANSPORTING OBJECTS UNDER CONTROLLED ATMOSPHERE

(71) Applicant: Commissariat A L'Energie Atomique et aux Energies Alternatives, Paris (FR)

(72) Inventor: Yoann Cure, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 298 days.

(21) Appl. No.: 16/594,119

(22) Filed: Oct. 7, 2019

(65) Prior Publication Data
US 2020/0108996 A1 Apr. 9, 2020

(30) Foreign Application Priority Data
Oct. 8, 2018 (FR) ...................................... 18 59316

(51) Int. Cl.
  *B65G 17/18* (2006.01)
  *B65G 35/06* (2006.01)
  *B65D 81/20* (2006.01)

(52) U.S. Cl.
  CPC ......... *B65D 81/2015* (2013.01); *B65G 17/18* (2013.01); *B65G 35/06* (2013.01)

(58) Field of Classification Search
  None
  See application file for complete search history.

(56) References Cited

U.S. PATENT DOCUMENTS

| | | | |
|---|---|---|---|
| 4,790,921 A * | 12/1988 | Bloomquist | .......... C23C 14/505 |
| | | | 414/217 |
| 5,641,054 A | 6/1997 | Mori et al. | |
| 6,183,615 B1 * | 2/2001 | Yasar | ................ H01L 21/67709 |
| | | | 204/192.12 |
| 6,336,775 B1 | 1/2002 | Morita et al. | |
| 9,947,562 B2 * | 4/2018 | Chen | ................... C23C 16/4583 |
| 2012/0181151 A1 * | 7/2012 | Ishino | .................... B65G 17/12 |
| | | | 198/842 |

FOREIGN PATENT DOCUMENTS

FR   3 014 405 A1   6/2015
JP   60-261302 A   12/1985

* cited by examiner

*Primary Examiner* — Kavel Singh
(74) *Attorney, Agent, or Firm* — Oblon, McClelland, Maier & Neustadt, L.L.P.

(57) ABSTRACT

System for transporting objects under controlled atmosphere comprising tubular sections connected together in a leak tight manner by their first ends, each tubular section, each section comprising a guide track for a trolley, each guide track comprising a first and a second end, the first ends of the guide tracks being opposite and separated from each other by a given distance. The transport system also comprises a spanning element rotationally hinged on a first end of the guide tracks around an axis orthogonal to a direction of displacement of said guide track. The spanning element is moveable between a raised position and a spanning position in which the guide tracks are connected enabling the passage of the trolley.

19 Claims, 7 Drawing Sheets

SYSTEM FOR TRANSPORTING OBJECTS UNDER CONTROLLED ATMOSPHERE

TECHNICAL FIELD AND PRIOR ART

The present invention relates to a system for transporting objects under controlled atmosphere, notably being able to be implemented in the microelectronics field.

In the microelectronics field, manufacturing processes often require a control of the atmosphere in which is found the microelectronic object, for example a substrate or wafer, during manufacture.

Circuits under controlled atmosphere, for example under ultra-vacuum, exist, enabling the transport of the object between two confined enclosures, in which technological steps may take place. Thus, the confinement under controlled atmosphere is never broken.

The circuit comprises for example tubes connected to each other in a leak tight manner and to which are connected enclosures also in a leak tight manner. One or more trolleys are displaced in the tubes to convey the objects from one enclosure to the other. The inner diameter of the tubes is sufficient for the circulation of the trolleys loaded with the substrates.

FIG. 12 shows such a circuit. The circuit is divided into sections leak tight with respect to each other in order to isolate the enclosures from each other. The isolation of the sections is obtained by gates V', comprising for example a door sliding transversally to the tubes. In order to modify the communication between two tubes, the door is slid. When the door is totally slid outside of the tube, the two sections on either side of the door are in communication and a trolley can circulate from one section to the other.

The trolley C' is displaced on a central rail arranged in the bottom of the tube. The trolley comprises bearings or rollers cooperating with the edges of the rail.

On the passage of the gate V', the rail is interrupted at the spot where the door slides into closed position. In FIG. 12 may be seen this gate passage zone Z'. The trolley C' must have a sufficient dimension in the direction of displacement and/or a sufficient number of rollers to ensure a spanning of the zone between the two sections which is not provided with rail, such that the trolley is correctly guided during the spanning between the upstream rail R1 and the downstream rail R2 and avoid a too important cantilever, which would misalign the trolley C' with respect to the downstream rail R and could sooner or later deteriorate the trolley and/or the transport system.

Other more complex and more expensive systems exist, in which the objects are displaced by arms to make them pass from sections to the other when the gate is open. On the one hand, this handling requires a very precise arm in order not to break the object when it is seized or let go. On the other hand, it requires very well calibrated objects so that they are seized correctly. These arms are of complex design and the production cost thereof is high, moreover they require regular adjustment.

DESCRIPTION OF THE INVENTION

It is consequently an aim of the present invention to offer a transport system under controlled atmosphere of relatively simple and robust realisation.

The aforementioned aim is attained by a system of transport by trolley under controlled atmosphere comprising at least two tubular sections, connectable and separated by a gate, each tubular section comprising at least one displacement path of a trolley. The gate comprises a door capable of transversally sliding with respect to the direction of displacement of the trolley and separating the two displacement paths. The system also comprises means enabling the trolley to span the zone where the door slides to pass from one enclosure to the other, said means comprising an element capable of passing from a raised position to a lowered position in which it forms an extension of the displacement paths. Thus, the trolley does not need to have a great length to ensure the spanning of this "empty" zone, but it is displaced on this element whatever its length. The spanning means are arranged on one side and/or the other of the zone and retract, for example when the door of the gate is put back in place and again separates the tubular sections.

In a very advantageous manner, the passage from one position to the other is obtained directly by the displacement of the door, for example during the closing of the door, this pushes the spanning element to its raised position which tilts over.

In other words, the transport system implements a member capable of filling a distance between two guide tracks. In a very advantageous manner, the system is of drawbridge type to span the gate zones and which extends the upstream and downstream tracks on which the trolley is displaced.

In an exemplary embodiment, the spanning element comprises, near to the gate passage, a spanning surface and means for hinging said surface, capable of passing from a first position in which the surface is in the prolongation of the displacement path, the gate being open, to a second position, in which the surface is in a raised position to enable the closing of the gate.

In a particularly advantageous manner, the displacement paths comprise side edges facing each other and parallel to the direction of displacement and with which the rollers of the trolleys cooperate. The central rail may then be eliminated, which makes it possible to reduce substantially the manufacturing costs and the production complexity. Indeed, the use of central rails imposes a very precise alignment between the rail of one section and the rail of the directly following section. Yet, this very precise alignment is complex and long to carry out, notably during the operation of baking the tubes, for example to obtain an ultra-vacuum. This baking operation leads to a misalignment of the rails, which imposes a dismantling of the system and a rectification of the rails. Thanks to the very advantageous example according to the invention, such a rectification step may be eliminated.

In a very advantageous manner, in an exemplary embodiment, the control of the position of the spanning element is entirely mechanical and automatic, said element bearing against the door when it isolates the two enclosures and drops while following the door, when the door slides to place in communication the two enclosures.

The subject matter of the present invention is then a system for transporting objects under controlled atmosphere comprising at least two sections, each comprising a first end and a second end, said sections being connected together in a leak tight manner by their ends, each section comprising at least one guide track for a trolley, each guide track comprising a first and a second end at the level of the first and second ends of the sections respectively, the ends of the guide tracks being opposite and separated from each other by a given distance D. The transport system also comprises means for spanning said distance D including at least one spanning element situated near to one at least of the opposite guide tracks, capable of being displaced between a first so-called rest position in which the spanning element frees the space between the guide tracks and a second so-called spanning position in which the spanning element extends the guide tracks.

The door is advantageously under the spanning element in open position such that the putting in place of the spanning element in the spanning position takes place by gravity.

In an alternative, the door is situated above the spanning element in open position, a return system such as a spring may then be associated with the spanning element.

In an exemplary embodiment, the spanning element and the door each comprise a magnet, the magnets being arranged and oriented such that, when the door is displaced to the rest position, the magnets repel each other causing the pivoting of the spanning element to a rest position.

The subject matter of the present invention is also a system for handling objects comprising at least one transport system according to the invention, and at least one chamber arranged along a tubular section and connected thereto advantageously in a leak tight manner, and means for transferring the objects between the trolley and said chamber.

The rail portion may be situated on the guide track or there above on the wall of the section; this rail portion is further advantageously situated at the centre of the guide track.

BRIEF DESCRIPTION OF THE DRAWINGS

The present invention will be better understood on the basis of the description that follows and the appended drawings in which.

DETAILED DESCRIPTION OF PARTICULAR EMBODIMENTS

Figure 1:
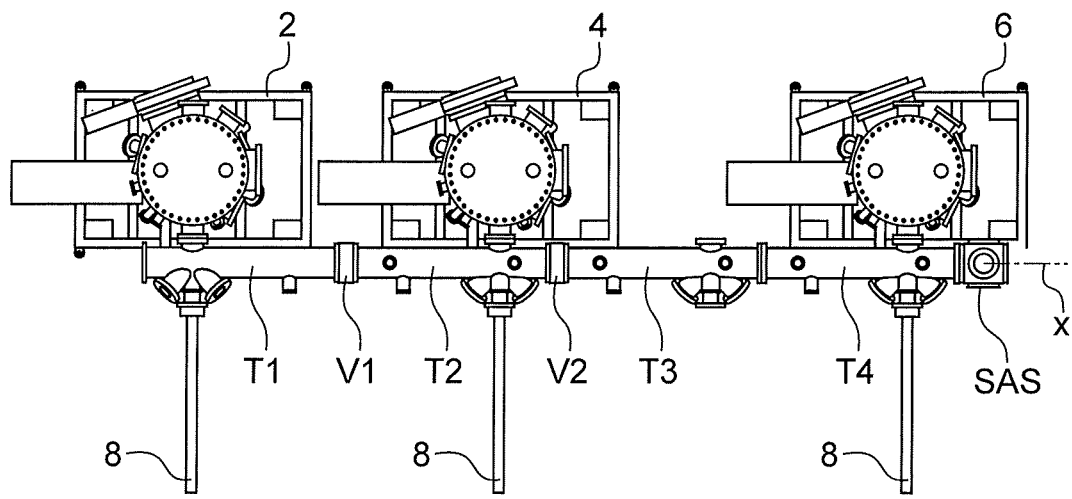
FIG. 1 is a top view of an example of a transport system under controlled atmosphere according to the invention.

In FIG. 1 may be seen a top view of an example of a transport system under controlled atmosphere according to the invention.

The present invention will be described within the scope of the transport of substrate holders, for example the transport of substrate holders made of molybdenum, called molyblocks, between different chambers in which the transported substrates undergo treatments, for example ultra-vacuum depositions. The invention may apply to the transport of any other object, for example to the transport of a load of material for example in certain ultra-vacuum systems or to the transport of capsule type objects for transporting persons who are in an atmosphere different from the controlled atmosphere, for example at atmospheric pressure. The capsule is then closed so as to isolate it from the controlled atmosphere reigning within the transport system, and may be equipped with seats for persons.

The transport system comprises a succession of tubes T1, T2, T3, T4 of circular section connected together in a leak tight manner and delimiting an inner volume isolated from the exterior. The tubes are aligned along the direction X.

In the present application, "tube", "section" or "tubular section" is taken to mean hollow lengthened elements of circular, elliptic, ovoid, polygonal section, for example square or rectangular, elliptic, etc., emerging at their two ends, these tubes may be straight and/or have one or more curvatures. The system comprises an airlock communicating with the exterior SAS connected to the end of the tube T4.

The transport system enables the displacement of a trolley C (FIG. 3) between different chambers 2, 4, 6, which are arranged laterally with respect to the succession of tubes and connected in a leak tight manner to the inner volume. Each chamber may be isolated from the inner volume by a gate (not represented).

The system also comprises transfer rods 8 intended to ensure the transfer of the substrate holders between the trolley C and a chamber 2, 4, 6. The rods are mounted translationally moveable in a transversal direction with respect to the direction X. The rods 8 comprise at a longitudinal end (not visible) situated in the system means for grasping the substrate holders, for example claws. The rods are handled by their other longitudinal end.

The inner volume is divided in a leak tight manner by gates V1, V2 notably ensuring a leak tight separation between portions of the inner volume each connected to a chamber.

Figure 2:
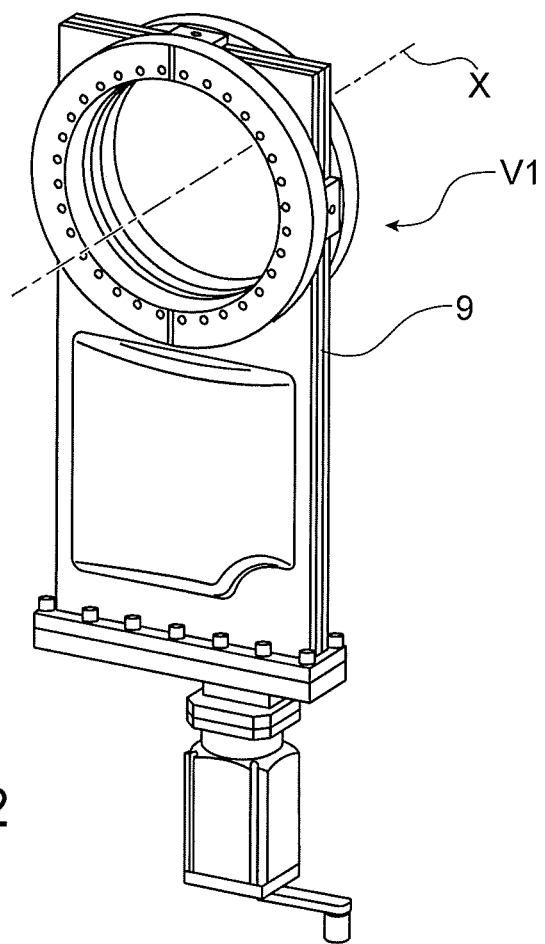
FIG. 2 is a perspective view of an example of gate of a transport system according to an example of the present invention.

In FIG. 2 may be seen a detailed view of an example of gate V1 in open position. The gate V1 comprises a door 9 mounted sliding transversally with respect to the direction X. To open the gate the door slides downwards. In an alternative, the door could pivot around an axis parallel to the axis X. The door may be orthogonal to the axis X or inclined with respect to the axis X.

Figure 3:
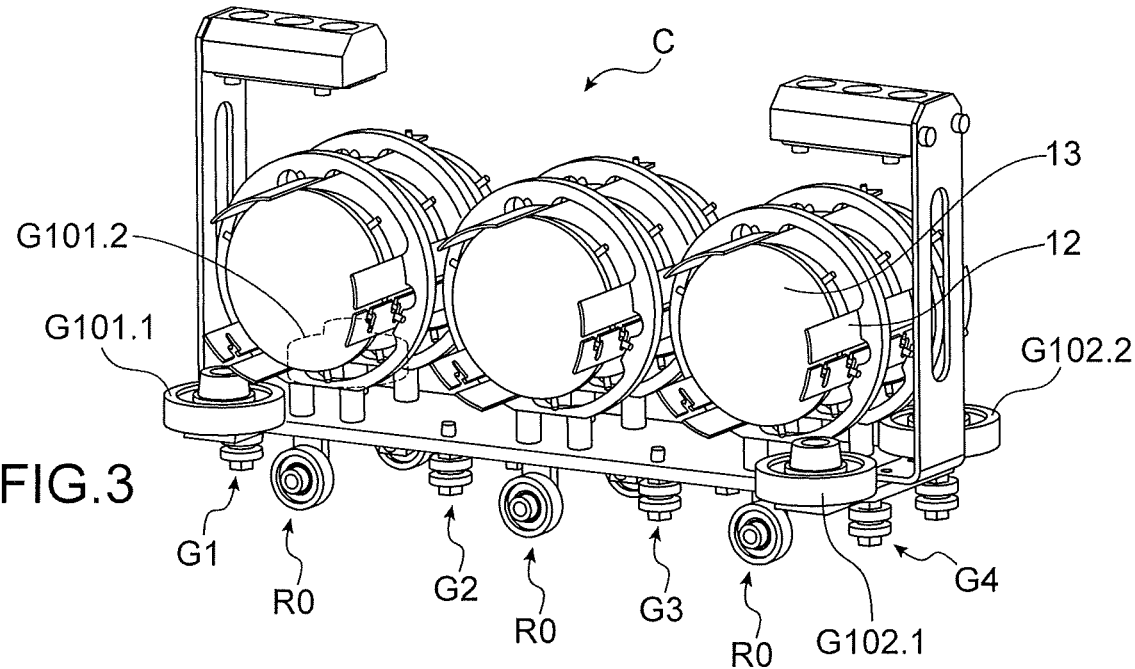
FIG. 3 is a perspective view of an example of trolley that can be used in the transport system according to the invention.

An example of trolley is represented in FIG. 3. It comprises a frame 10 provided with castors RO intended to roll on the guide track. It also comprises pairs of first rollers or bearings G1, G2, G3, G4 distributed along the direction along which the trolley is intended to be displaced and of vertical axis. The first rollers are intended to cooperate with a portion of centring rail 30 which will be described below.

It also comprises pairs of second rollers or bearings G101.1, G101.2, G102.1, G102.2, two in the example represented and situated at the two longitudinal ends of the trolley and intended on the one hand to realign the trolley with respect to the guide track and on the other hand to aid the trolley to turn in a bend.

"Roller" or "bearing" is taken to mean any element enabling the displacement and/or the guiding of the trolley and notably a wheel, a ball, a roller.

The trolley comprises housings 12 for substrate holders 13. The trolley is intended to slide or to roll in the transport system.

The transport system also comprises means for guiding the trolley C along the direction of displacement. To do so, the lower bottoms of the tubes comprise guide tracks 14, 15 with which the rollers are going to cooperate. In an alternative, several guide tracks may be superimposed or juxtaposed in the sections.

Figure 5A:
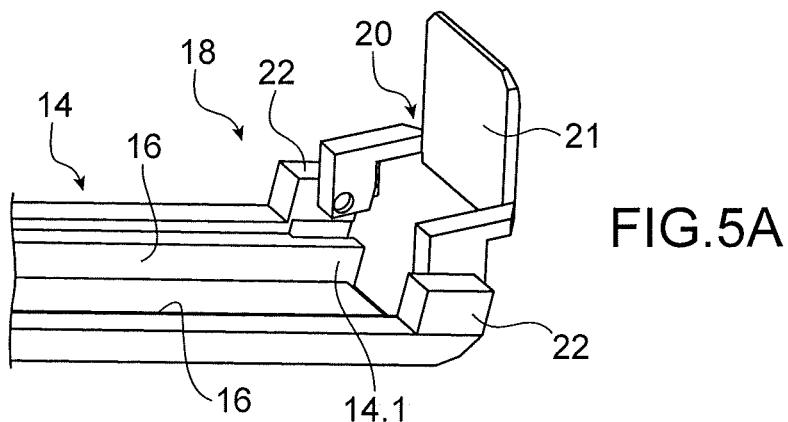
FIGS. 5A and 5B are perspective view of a spanning element in a raised position and in a spanning position respectively.
Figure 5B:
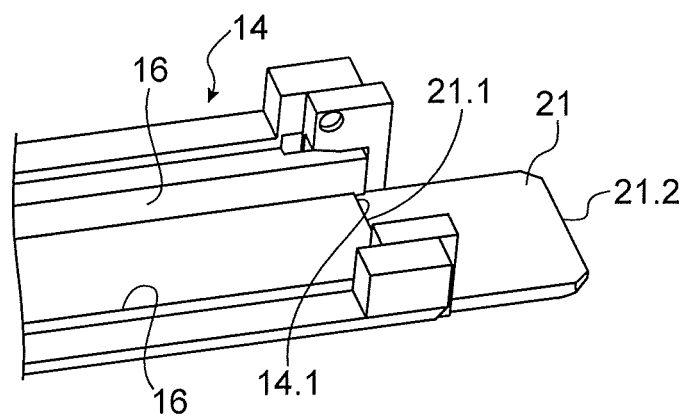

In FIGS. 5A and 5B may be seen a particularly advantageous example of each guide track comprising outer side edges 16 transversally delimiting the width of the guide track and forming two treads for the rollers. Thus, the rollers G101.1, G101.2, G102.1, G102.2 of a pair each cooperate with an outer side edge 16. The rollers are then guided from the outside. A clearance is provided between the rollers and the side edges 16, for example of 1 mm to 2 mm. The contact between the rollers and the side edges 16 is not in general continuous. The cooperation between the rollers the side edges makes it possible to realign the trolley with the axis X, when the trolley moves away too much from the axis X. In an alternative, the trolley does not comprise wheels Ro and comprises a sliding surface intended to slide on the guide tracks.

The guide tracks are interrupted at the level of the gates, designated gate zones, in order to enable the closing of the gates and the putting in place of the doors. The free ends opposite two successive guide tracks at the level of a gate are separated by a distance D (FIG. 6C).

The transport system also comprises means 18 for spanning gate zones. The spanning means 18 are such that, when the gate is open, the trolley can pass from one guide track to another through the gates.

The spanning means 18 comprise at least one element 20 capable of filling at least partially the gate zone between the two guide tracks when the gate is open and to be hidden during the closing of the gate.

To simplify the description, the designations upstream guide track and downstream guide track on either side of the gate zone will be used, but the terms "upstream" and "downstream" are not limiting as regards the displacement of the trolley, since the trolley can circulate in both directions and thus from downstream to upstream.

Moreover, "proximal" is taken to mean the ends of the guide tracks situated near to the gate zone.

In the example represented, the element 20 is rotationally hinged on a proximal end 14.1 of the upstream guide track 14, around an axis Y orthogonal to the axis X. The element 20 comprises a spanning surface 21 formed by a plate filling the gate zone and preventing the trolley from tilting into the gate zone. The guiding is ensured by rollers G101.1, G101.2, G102.1, G102.2 further cooperating with the side edges of the upstream track and/or by the rollers already cooperating with the side edges of the downstream track. In this example the trolley rolls on the spanning surface 21.

The dimension of the spanning element 20, considered along the direction of displacement, is less than or equal to the distance D, the difference between said distance D and the length of said spanning element 20 being less than the length of the trolley.

Figure 4A:
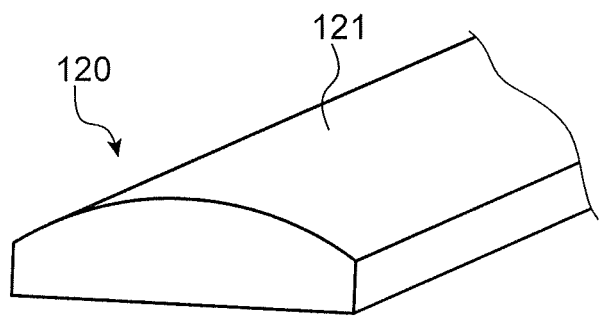
FIGS. 4A and 4B are perspective views of alternative embodiments of spanning elements.
Figure 4B:
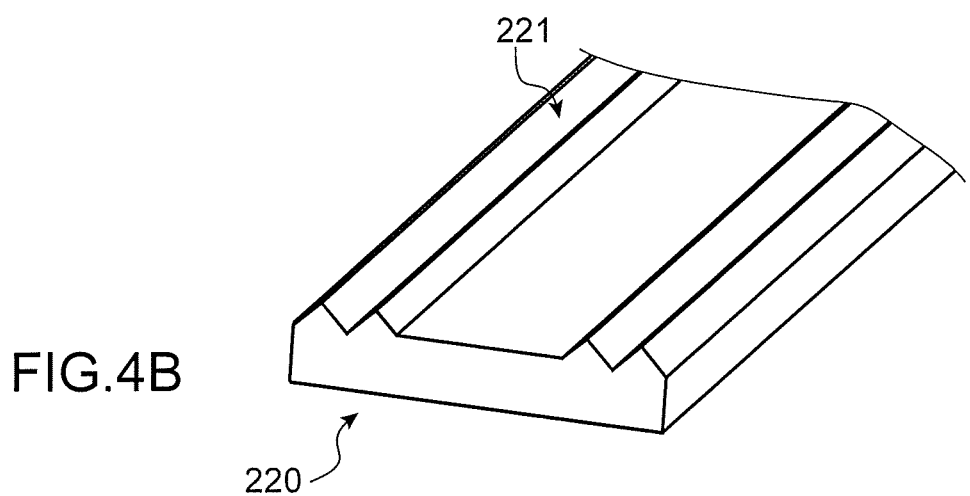

In this example, the spanning surface is flat. In an alternative, the spanning element 120 has a bulging spanning surface 121 (FIG. 4A) or the spanning element 220 has a spanning surface 221 comprising a sawtooth structure (FIG. 4B) forming two lateral rails. These rails may potentially serve as guide for the wheels of the trolley. Other shapes of spanning surface may be envisaged.

Figure 5C:
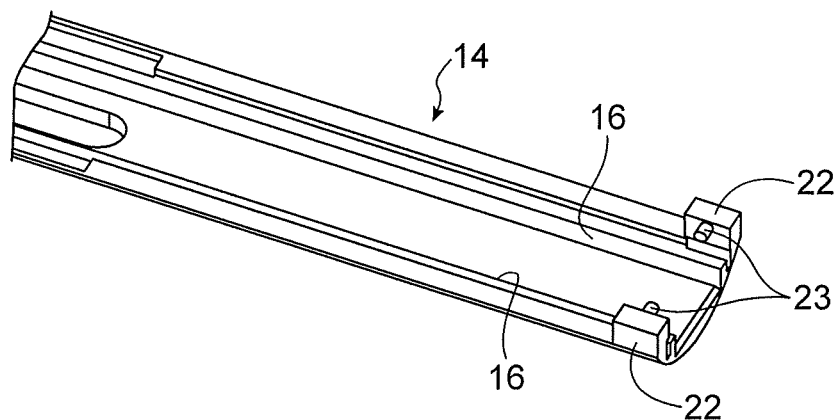
FIGS. 5C and 5D are perspective views of a guide track and of the spanning element respectively.
Figure 5D:
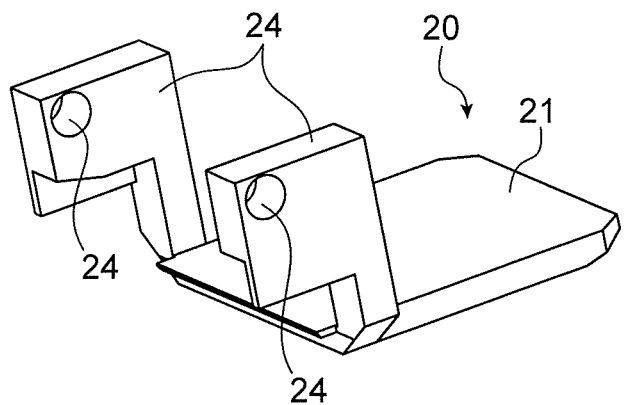

In the example represented, the spanning element is rotationally hinged by means of two pins 22 borne by two legs 23 integral with the upstream runway track (FIG. 5D). The pins 22 are projecting towards the inside of the runway track without hindering the passage of the trolley. In an alternative, the pins 22 project laterally outside of the runway track, the legs 24 are then arranged outside of the legs 23.

It will be understood that one or more than two pins may be envisaged to ensure the hinging of the spanning element on the end of the guide track.

The spanning element comprises two legs 24 each provided with a drilling 26 each receiving a pin (FIG. 5C). The legs 24 are arranged between the legs 23.

Conversely, the pins may be borne by the element 20 and the drillings by the guide track 14.

Another pivot joint of hinge type may be envisaged.

In this example, when the spanning element 20 is in spanning position, the longitudinal end 21.1 of the spanning surface oriented on the side of the upstream guide track 14, on which it is hinged, is in abutment against the free proximal end 14.1 thereof, forming on the one hand therewith a continuous displacement surface, and ensuring on the other hand the maintaining of the spanning element in the spanning position. The other longitudinal end 21.2 of the spanning surface is located opposite the free proximal end of the downstream guide track at a reduced distance therefrom, for example at a distance enabling the pivoting of the spanning element without contact.

As a variant, the longitudinal end 21.1 may not come in abutment against the free proximal end of the downstream track, in the case where the maintaining of the spanning element is moreover ensured. For example, it is possible to envisage that the free end 21.2 comes to bear against the free proximal end of the downstream track, then ensuring the maintaining. It may be envisaged to arrange a recess in the free proximal end of the downstream track to house the end 21.2 of the spanning surface.

In another example, the element 20 comprises, like the guide tracks, guide side edges separated from each other by a distance substantially equal to that separating the guide elements of the guide tracks, such that when the spanning element is in place, substantially continuous side edges are formed with which the rollers can cooperate. The guiding of the trolley is then ensured by the spanning element itself, it does not form uniquely a sliding surface. In this case, the trolley may be of reduced length and the rollers closer to each other, since the guiding is not ensured uniquely by the edges of the upstream and downstream tracks on either side of the gate zone.

In FIG. 5A may be seen the spanning element in raised position and in FIG. 5B in spanning position, while the door is open.

Figure 6A:
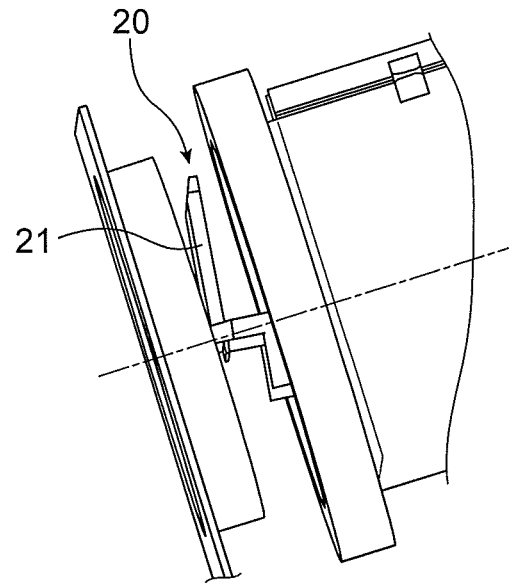
FIGS. 6A to 6C are perspective views of the different configurations of an example of the transport system according to the invention at the passage of a gate between a gate in closed position and a gate in open position.
Figure 6B:
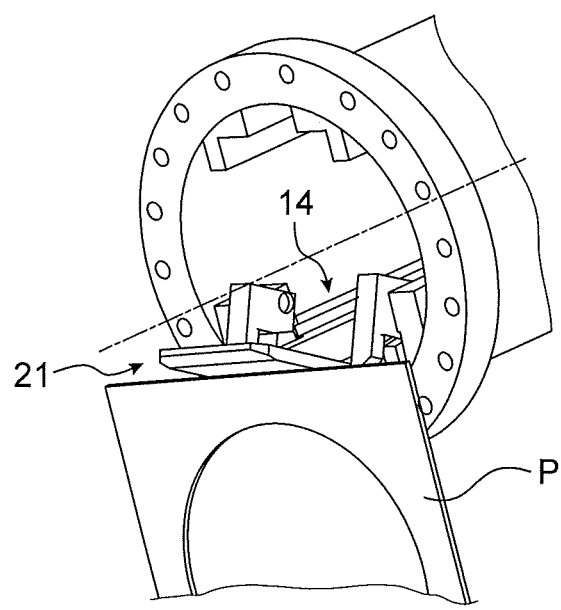
Figure 6C:
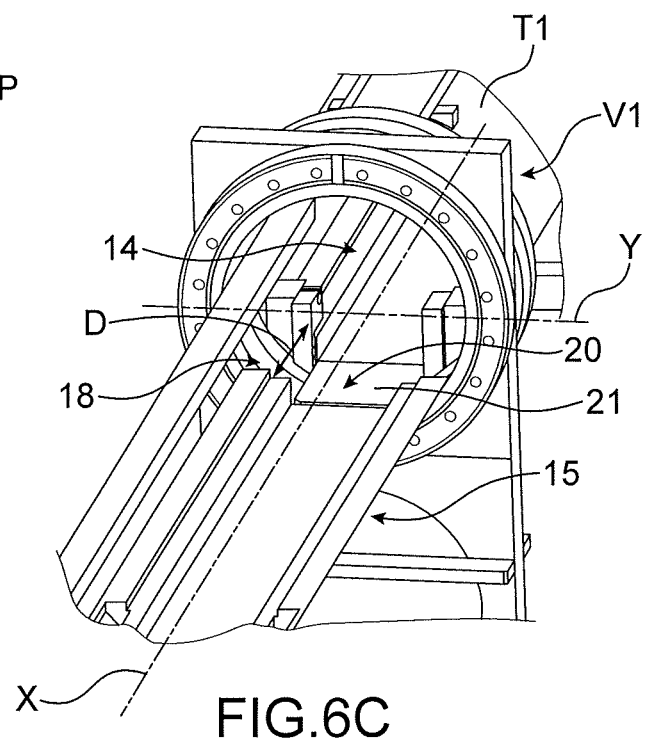

In FIGS. 6A to 6C may be seen the cooperation between the spanning element and the door of the gate.

In FIG. 6A, the door P is closed and the spanning element 20 is bearing against the door. In FIG. 6B, the door P is being opened, it slides downwards, the spanning element 21 is bearing on the door and follows its displacement under the effect of gravity, the spanning element pivots to the position aligned with the guide tracks. In FIG. 6C, the door P is completely open, the spanning element 20 is aligned with the upstream 14 and downstream 15 guide tracks, a guide track between the upstream and downstream guide tracks is formed.

During the closing of the door P, it enters into contact with the spanning element 20 from below and pushes it back, it pivots in the opposite direction and recovers its raised position.

The spanning element is arranged above the upper end of the door in open position. Thus, when closing, the door actually pushes the spanning element either by mechanical contact, or by magnetic repulsion.

The operation of the system is very robust, because it does not implement electromechanical means. Moreover, the system advantageously uses the displacement of the door of the gate which was already in place in existing systems.

According to another variant, the spanning means comprise two spanning elements, one rotationally hinged on the proximal end of the upstream rail and the other rotationally hinged on the proximal end of the downstream rail; of the twin deck drawbridge type. Thus, each spanning element pivots in the direction opposite to the other, around its axis of rotation, and their free ends face each other when they are in spanning position.

In a further variant, the spanning means comprise a spanning element maintained in raised position by a spring or a spring blade for example arranged under the spanning element. The tilting of the spanning element into the spanning position is then obtained under the action of the weight of the trolley which is brought up against the spanning element.

In an exemplary embodiment, the displacement of the spanning element is controlled by magnetic means. For example, the spanning element(s) comprise a permanent magnet and the door also comprises a permanent magnet. The poles of the magnets are oriented such that a repulsive force appears between the door and the spanning element(s), when the door rises. The control of displacement of the spanning element then takes place without mechanical contact between the door and the spanning element(s).

In the example described the guide tracks and the spanning element form a road, the trolley being guided uniquely by the side edges.

In another example, the guide tracks comprise a central rail and the spanning element comprises a central rail which, when the spanning element is in spanning position, is aligned with the rails of the upstream and downstream tracks. The rollers G1, G2, G3, G4 cooperate with the central rails. In an alternative, the spanning element does not comprise a rail and is formed by a road portion. The alignment of the rails nevertheless is more complex.

In the example of FIGS. 5A to 6C, it is possible to envisage replacing the spanning element by a spanning element provided with a central rail.

The displacement of the trolley in the system may be carried out from the outside by means of magnets which are displaced along the transport system and exert an attraction on the trolley which is made of a material capable of being attracted by one or more magnets. The trolley may itself bear magnets. In FIG. 3, the trolley comprises magnets on its upper part above housings of the substrates. The outer magnets are for example guided along sections outside of them and above them so as to be able to be directly in line with magnets borne by the trolley, the magnets are for example guided by rails.

In another example made possible by the implementation of spanning elements, the displacement means comprise two electrical tracks along the guide tracks and the spanning elements and an electric motor borne by the trolley and supplied via electrical tracks. The conductive tracks are connected to an electric source situated outside of the system, through leak tight electrical vias.

The implementation of spanning elements makes it possible to maintain the supply of the motor during the crossing of a gate zone.

The implementation of guide tracks in which the trolley is guided by outer side edges has a certain number of advantages. On the one hand, the production of a transport system with such tracks is simpler than in the case of a system implementing rails, since it does not require the different steps of alignment and of re-alignment of the rails.

Figure 7:
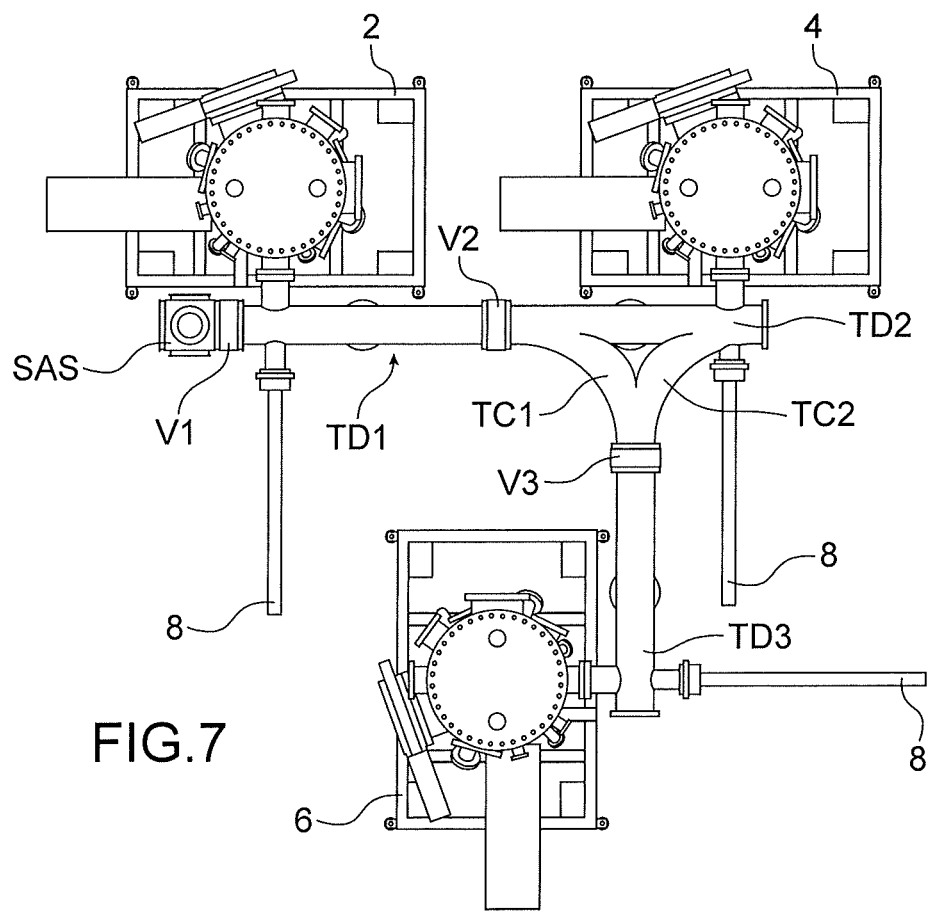
FIG. 7 is a top view of another example of transport system according to the invention.

Moreover, guiding by the side edges makes it possible to produce transport systems with bends such as represented in FIG. 7, whereas the implementation of rails prevents the production of bends which could block the trolley.

The second rollers of the pairs G101, G102 of vertical axis ensure the guiding of the trolley in the bends. Indeed, for example when the trolley attacks a bend turning towards the right, for example driven by an outer magnet, the right side bearings (G101.1, G102.1 in the representation of FIG. 3) enter into contact with the side edge 16, which ensures a progressive rotation of the trolley.

The production of curved guide tracks offers numerous possibilities in terms of handling of the trolleys and orientation of the chambers along the transport system.

The transport system of FIG. 7 comprises a first straight section TD1, extended by a second straight section TD2 and separated from the first straight section TD1 by a gate V2. The transport system comprises a first curved portion TC1 connecting by a first end to the first straight section TD1 at the gate V2 in parallel with the second straight section TD2. The system also comprises a second curved section TC2 extending between the second end of the first curved section TC2 and the end of the second straight section TD2 not connected to the first straight section TD1. A third straight section TD3 is connected to the first and second curved sections TC1 and TC2 through a gate V3. The circuit of the transport system substantially has a T shape. The transport system also comprises an airlock communicating with the exterior SAS connected to the free end of the first straight section TD1 and making it possible to load/unload the trolley. A gate V1 is interposed between the airlock and the first straight section TD1.

The transport system comprises spanning elements such as described above at the gate passage.

The transport system ensures the displacement of trolleys between several chambers 2, 4, 6.

The production of such a circuit is enabled by the implementation of a guide track without rail.

Examples of displacement enabled by such a circuit will now be given.

Figure 8:
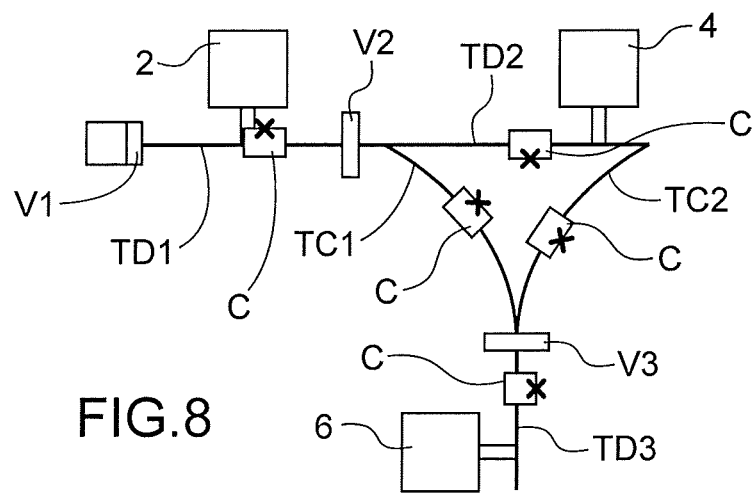
FIG. 8 is a schematic representation of the system of FIG. 7 in which is displaced a trolley.

This circuit makes it possible to turn around a trolley. The displacement of the trolley is shown schematically in FIG. 8 by the rectangle. One face of the trolley is marked by a cross.

Indeed, the trolley enters into the system via the airlock. It circulates in the first straight section TD1, then in the first curved section TC1 while circulating on a spanning element through the gate V2, then in the third straight section TD3 while circulating on a spanning element through the gate V3. Next, the trolley C is displaced in the opposite direction on the third straight section TD3, traverses the gate V3 while circulating on the spanning element and circulates on the second curved section TC2. On arrival at the other end of the second curved section TC2, the trolley circulates on the second straight section TD2 in the direction of the first straight section TD1. It is noted that the face of the trolley marked by a cross has changed side with respect to the direction of displacement on the first and second straight sections TD1 and TD2, the trolley has actually been turned around. Such a turnaround cannot be done with a rail transport system of the prior art.

This circuit also makes it possible to use several trolleys in the same transport system and to enable the crossing thereof.

Indeed, when a first trolley is already in the transport system, it is possible to introduce a second trolley and to arrange the trolley facing any one of the chambers. Indeed, the first trolley may be stored temporarily, for example in the first or the second curved section TC1 and TC2, to leave the passage free for the second trolley. Thus, it is possible to create a reserve or a storage track for one or more trolleys. Moreover, the first trolley may be extracted from the system before the second trolley. This cannot be done with a transport system provided with rails, in such a system the trolley introduced later cannot cross the trolley introduced before, and it has to be removed before introducing the other trolley.

A transport system such as that of FIG. 7 may for example make it possible to increase the treatment efficiency of the substrates.

Moreover, the combined implementation of guide tracks without rail and spanning element may make it possible to pass a trolley between two guide tracks shifted vertically. For example, by opening the gate half-open, it is possible to mount a trolley on a downstream track of upper stage. By fully opening the gate, the spanning element comes to extend the road in the same plane.

Indeed, the spanning element may have several angular orientations with respect to the guide track on which it is hinged.

Figure 9:
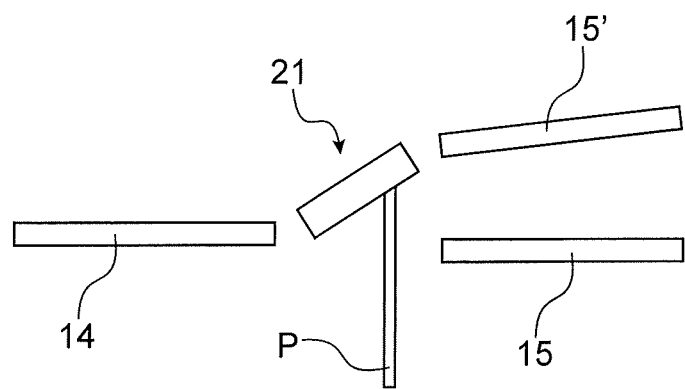
FIG. 9 is a schematic representation of an example of a transport system according to the invention enabling an out-of-plane displacement of the trolley.

In FIG. 9 may be seen a schematic representation of an example of such a circuit. The degree of opening of the door P adjusts the tilting angle of the spanning element and orients the free end of the spanning element towards one or the other of the superimposed downstream guide tracks 15, 15'. It will be understood that the angle of inclination of the spanning element with respect to the track to which it is hinged is sufficiently large to enable the trolley to circulate from the guide track onto the spanning element without jamming and in security. The length of the spanning element is preferably chosen to facilitate the circulation of the trolley.

Advantageously, the downstream guide tracks may be inclined in the direction of the gate to facilitate the passage of the trolley.

In addition, the guide tracks without rail may also have a certain curvature in an out-of-plane direction.

It is then possible to produce transport systems in three dimensions.

Figure 10:
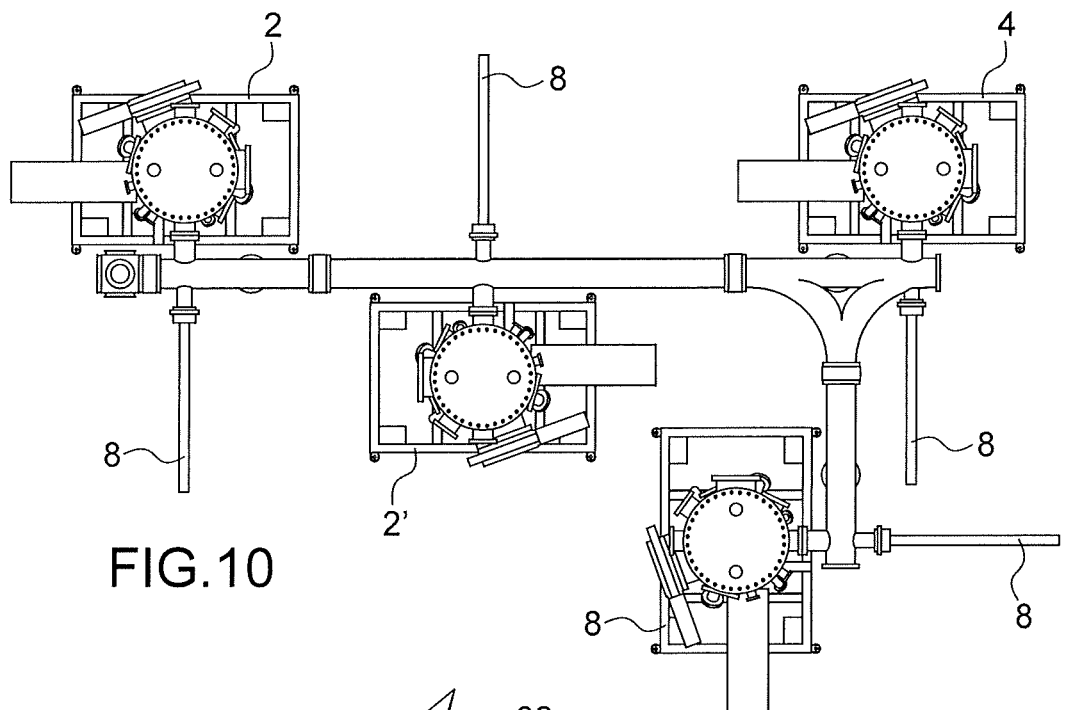
FIG. 10 is a top view of an alternative embodiment of the transport system of FIG. 7.

Furthermore, such displacement tracks offer great freedom in the arrangement of the chambers with respect to the direction of displacement, which may enable a significant space saving for the circuit. In FIG. 10 the transport system is very similar to that of FIG. 7, it comprises an additional chamber 2' on the first straight section TD1 but situated opposite the chamber 2' with respect to the direction of displacement. Indeed, since the trolley may be turned around, it may present the same face to the chamber 2 and to the chamber 2', after having taken the turnaround zone formed by the sections TC1, TC2, TD2. In a transport system of the prior art implementing rails, the chambers are necessarily always on the same side with respect to the direction of displacement.

In a very advantageous manner, the transport system comprises means for positioning 28 the trolley with respect to the chambers to make it possible to handle the elements on the trolley by means of a rod. The Inventor has determined that the precise positioning of the trolley was not required throughout the displacement of the trolley(s), and that the precise positioning was sufficient when a transfer between the trolley and a chamber was required.

Figure 11:
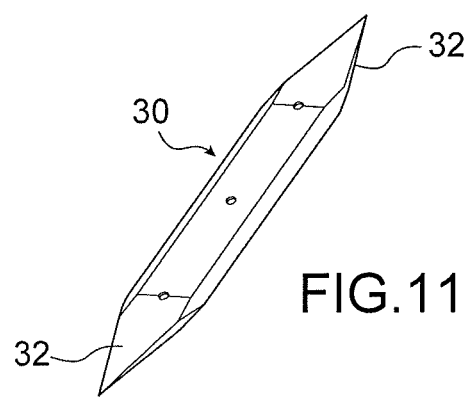
FIG. 11 is a perspective view of an example of means for positioning the trolley, represented alone.
Figure 12:
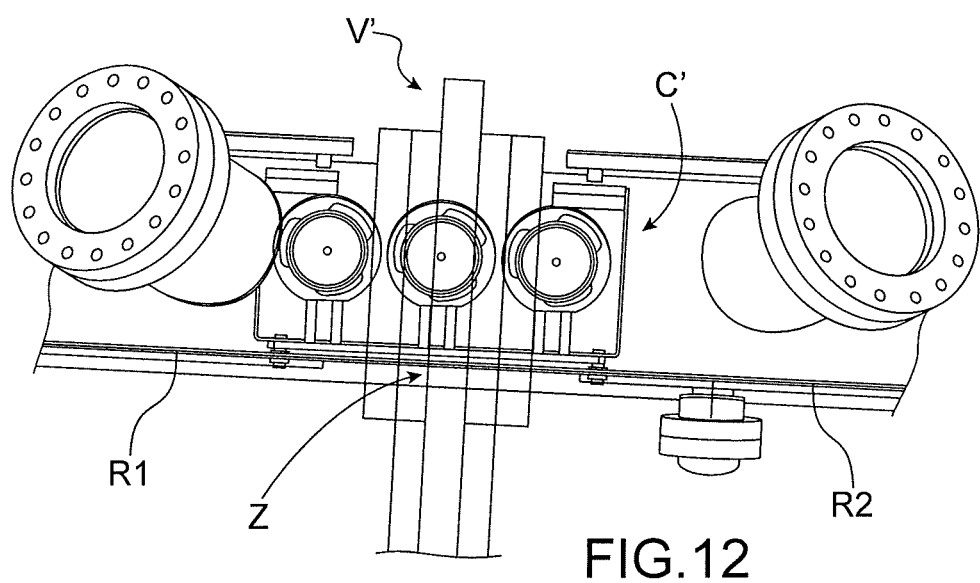
FIG. 12 is a side view of a transport system of the prior art at the level of a gate passage.

For example, the positioning means 28 comprise a rail portion 30 represented alone in FIG. 11, fixed on the guide track in line with a chamber. When the trolley arrives at a chamber, the rollers G1, G2, G3, G4 naturally cooperate with the rail portion 30, and automatically ensure the centring and the positioning of the trolley with respect to the chamber.

In order to facilitate the positioning of the rollers with respect to the rail portion, it comprises bevelled longitudinal ends 32.

In a variant, the precise positioning of a trolley with respect to a chamber may be obtained through outer edges having a finer machining only at the chambers.

In the examples described, the spanning element is hinged on one or more guide tracks. In an alternative, the spanning element is integral with the door of the gate at the level of its upper end, for example it extends perpendicularly to the door, the door and the spanning track having, seen from the side, a T shape. When the door drops, the spanning element also drops and is aligned with the upstream and downstream guide tracks.

The invention claimed is:

1. A system for transporting objects under a controlled atmosphere, comprising:
    at least two sections, each section comprising a first end and a second end,
        said at least two sections being connected together in a leak tight manner by their ends, and
        each of said at least two sections comprising at least one guide track for a trolley, each guide track comprising a first end and a second end at a level of the first end and the second end of the sections respectively, the ends of the guide tracks facing each other and separated from each other by a given distance D; and
    means for spanning said distance D including at least one spanning element situated near at least one of the guide tracks configured to be displaced between a rest position, in which the spanning element frees a space between the guide tracks, and a spanning position, in which the spanning element extends the guide tracks to make the guide tracks longer.

2. The system for transporting objects according to claim 1, wherein said at least one spanning element is rotationally hinged on an end of the at least one of the guide tracks, around an axis orthogonal to a direction of a displacement of said at least one of the guide tracks, said spanning element being moveable between the spanning position and the rest position.

3. The system for transporting objects according to claim 1, wherein the ends of the sections are connected in a leak tight manner by a gate, said gate comprising a door arranged between the ends of the guide tracks which face each other.

4. The system for transporting objects according to claim 3, wherein a passage from one position to another of the spanning element is controlled by a displacement of the door.

5. The system for transporting objects according to claim 4, wherein the door comprises an upper end arranged under or above the spanning element in an open position so as to enable a hinging of said spanning element.

6. The system for transporting objects according to claim 4 wherein, in the rest position, the spanning element bears against the door, such that when the door is displaced to an open position, the spanning element pivots by gravity to the spanning position.

7. The system for transporting objects according to claim 4, wherein the spanning element and the door each comprise a magnet, the magnets being arranged and oriented such that, when the door is displaced to the rest position, the magnets repel each other causing a pivoting of the spanning element to the rest position.

8. The system for transporting objects according to claim 1, further comprising
at least one leak tight gate arranged between the at least two sections, and
a movable part configured to isolate or to connect the at least two sections, the spanning element being situated on the movable part of the gate.

9. The system for transporting objects according to claim 1, wherein the spanning element comprises a spanning surface formed by a plate.

10. The system for transporting objects according to claim 1, wherein said trolley includes at least one pair of rollers, the rollers being arranged between the trolley and the at least one guide track to enable a displacement of the trolley along a direction of the displacement of the trolley and to ensure an alignment of the trolley with respect to the at least one guide track.

11. The system for transporting objects according to claim 10, wherein the guide tracks each comprise two opposite side edges, at least one roller of each of the at least one pair of rollers cooperating with a side edge so as to ensure a guiding of the trolley along the direction of the displacement.

12. The system for transporting objects according to claim 1, further comprising at least one curved section so as to form a two dimensional displacement circuit.

13. The system for transporting objects according to claim 1, further comprising several curved sections and at least one straight section laid out with respect to each other to form a turnaround and/or reserve zone for said trolley.

14. The system for transporting objects according to claim 1, wherein the ends of the sections are connected in a leak tight manner by a gate, said gate comprising a door arranged between the ends of the guide tracks which face each other, said door being movable transversally with respect to a direction of a displacement of the guide tracks.

15. A system for handling objects, comprising:
said system for transporting objects according to claim 1;
at least one chamber arranged along one of the at least two sections and connected thereto; and
at least one transferring device for transferring the objects between the trolley and said chamber.

16. The system for handling objects according to claim 15, further comprising at least one positioner for positioning said trolley in a given position with respect to the chamber and the at least one transferring device.

17. The system for handling objects according to claim 16, wherein
the at least one positioner comprises at least one rail portion arranged in a direction of a displacement in said one of the at least two sections and between the chamber and the at least one transferring device, and
the trolley comprises rollers configured to cooperate with said at least one rail portion.

18. The system for handling objects according to claim 15, wherein
the objects are substrates borne by substrate holders,
the controlled atmosphere is an ultra-high vacuum, and
the at least one chamber is a deposition chamber.

19. The system for handling objects according to claim 15, wherein the at least one chamber is connected to said one of the at least two sections in a leak tight manner.

* * * * *